THERMOELECTRIC APPARATUS

Filed Dec. 20, 1963 3 Sheets-Sheet 1

United States Patent Office 3,178,895
Patented Apr. 20, 1965

3,178,895
THERMOELECTRIC APPARATUS

Cecil J. Mole, Monroeville, and William M. Wepfer, Pittsburgh, Pa., assignors to Westinghouse Electric Corporation, Pittsburgh, Pa., a corporation of Pennsylvania Filed Dec. 20, 1963, Ser. No. 331,997
19 Claims. (Cl. 62—3)

This invention relates to thermoelectric apparatus and more particularly to the construction of new and efficient arrangements of thermopiles for varying the temperature of fluid media, or for use with fluid media of differing temperatures for producing electrical power through the use of thermoelectric effects.

In our copending application, Serial No. 320,160, filed October 30, 1963, entitled Thermoelectric Heat Pumping Apparatus, and assigned to the present assignee, there are described in detail a thermoelectric heat exchange device and an electrical generator utilizing a novel approach or principle for obtaining high efficiency at relatively low cost and for utilizing relatively small amounts of thermoelectric material. The principle of the above device is known as "direct transfer," that is, there is provided a heat flow path in the thermoelectric apparatus having no electrical or heat insulation therein, so that substantially all of the heating or cooling produced at the thermoelectric hot and cold junctions are transferred directly to the heating or cooling media of the thermoelectric heat exchanger, without passing through electrical or thermal insulation.

In another of our copending, coassigned applications, Serial No. 332,010 filed concurrently herewith and entitled Thermoelectric Apparatus, there is described a liquid to air thermoelectric heat exchanger and electrical generator wherein the current flow path between adjacent thermoelectric members passes through the heat exchange arrangement exposed to the gaseous medium. The electrical flow path between adjacent thermoelectric layers is maintained by means of insulating members connecting the liquid flow path so that none of the thermoelectric layers are by-passed along the liquid flow path. The insulating members in the latter application are sealingly mounted between adjacent stages of the liquid flow path to form a single series connected liquid passageway.

The present invention is directed to modifications and improvements of the latter patent application in that there is provided a structure for the thermoelectric apparatus which is not only compact but shock-proof. In the instant arrangement, retaining members are provided for fixedly positioning each of the component parts of the thermopile, and means are provided for absorbing thermal expansive and contractive forces exerted upon the thermopile parts. More particularly, this invention provides an improvement of the type of connecters for the liquid flow path in that there is provided a highly electrically resistive coupling member hermetically sealed to the electrically conductive segments of the liquid flow path and having sufficient flexibility and mechanical compliance to withstand thermal cycling within the thermopiles. In addition, the metallic fins of a metal to air heat exchange portion of the thermoelectric device form segments of the current flow path in the thermopile.

Accordingly, it is an object of this invention to provide a new and improved thermopile having no electrical insulation in the heat flow path and being of compact size and shock-proof construction.

Another object of this invention is to provide a new and improved thermopile having a liquid flow path formed in electrically conductive members and having connecters of insulating material hermetically joined to adjacent ones of the electrically conductive members to connect the liquid flow paths of such members in series.

Another object of this invention is to provide a pair of electrically conductive block members having a liquid flow path therein with a high resistance connecter to couple the flow paths in series so that the connecter absorbs thermally induced expansive and compressive forces exerted upon the block members.

Still another object of this invention is to provide a new and improved thermopile of the air to liquid type having no electrical insulation in the heat flow path and having an air heat exchange portion of the thermopile also forming a segment of the current flow path of the device.

It is a further object of this invention to provide a new and improved thermopile having retaining members for fixedly positioning the parts of the thermopile and having expansible connectors for absorbing thermally induced stresses exerted upon the thermopile parts.

Another object of this invention is to provide novel and efficient electrically resistive connecters for the liquid flow path of a thermopile.

Still another object of this invention is to provide an efficient connecter for the liquid flow path of a thermopile which is electrically resistive, hermetically secured to the remaining liquid flow path portions, and capable of absorbing forces exerted thereon caused by thermal expansion and contraction of the remaining liquid flow path portions.

Briefly, the present invention accomplishes the above cited objects by providing, in one example, a liquid to gas thermoelectric construction or thermopile wherein there is provided a gaseous flow circuit disposed intermediate a pair of liquid flow circuits. Each of the liquid flow circuits comprises a plurality of passageways formed in conductive members. The conductive members extend between adjacent layers of thermoelectric material in the electrical flow path and the liquid flow path is formed by each passageway being connected in series by electrically resistive coupling elements or conduits. The coupling elements desirably are formed to expand and contract during thermal cycling of the thermopile, for example from bellows, and from a material compatible with the material forming the conductive members so that a hermetic joint therebetween is made. The gaseous flow path means desirably extends between adjacent ones of the conductive members along a predetermined current flow path and are formed from electrically conducting material such that the heat transfer area of the gaseous flow path means also forms a segment of the electrical current flow path of the thermopile.

The thermopile of this invention is provided with a pair of retaining members which are interfitted with the parts of the thermopile with the retaining members being secured together to produce a compact and shock-proof thermopile construction. In this connection, each of the bellows cooperates to absorb forces induced thereon by thermal expansion and contraction of the fixedly positioned conductive members of the thermopile.

In a further embodiment of this invention there is provided a liquid to liquid thermoelectric construction providing the hermetic sealing of the connecters of the liquid flow path and also providing the retaining members and expansive connecters to improve the shock resistance of the thermopile. In a still further embodiment of this invention there are provided electrically insulated joints between adjacent ones of the conductive liquid accommodating members with the joints formed from ceramic sleeve and having metallic sleeves extending between the ceramic sleeve and the electrically conductive members and hermetically secured to the ceramic sleeve and the conductive member.

Further objects and advantages of this invention will become apparent as the following description proceeds and features of novelty which characterize the invention will be pointed out in particularity in the claims annexed to and forming a part of this specification.

For a better understanding of this invention, reference may be had to the accompanying drawings, in which.

Figures 1, 4:
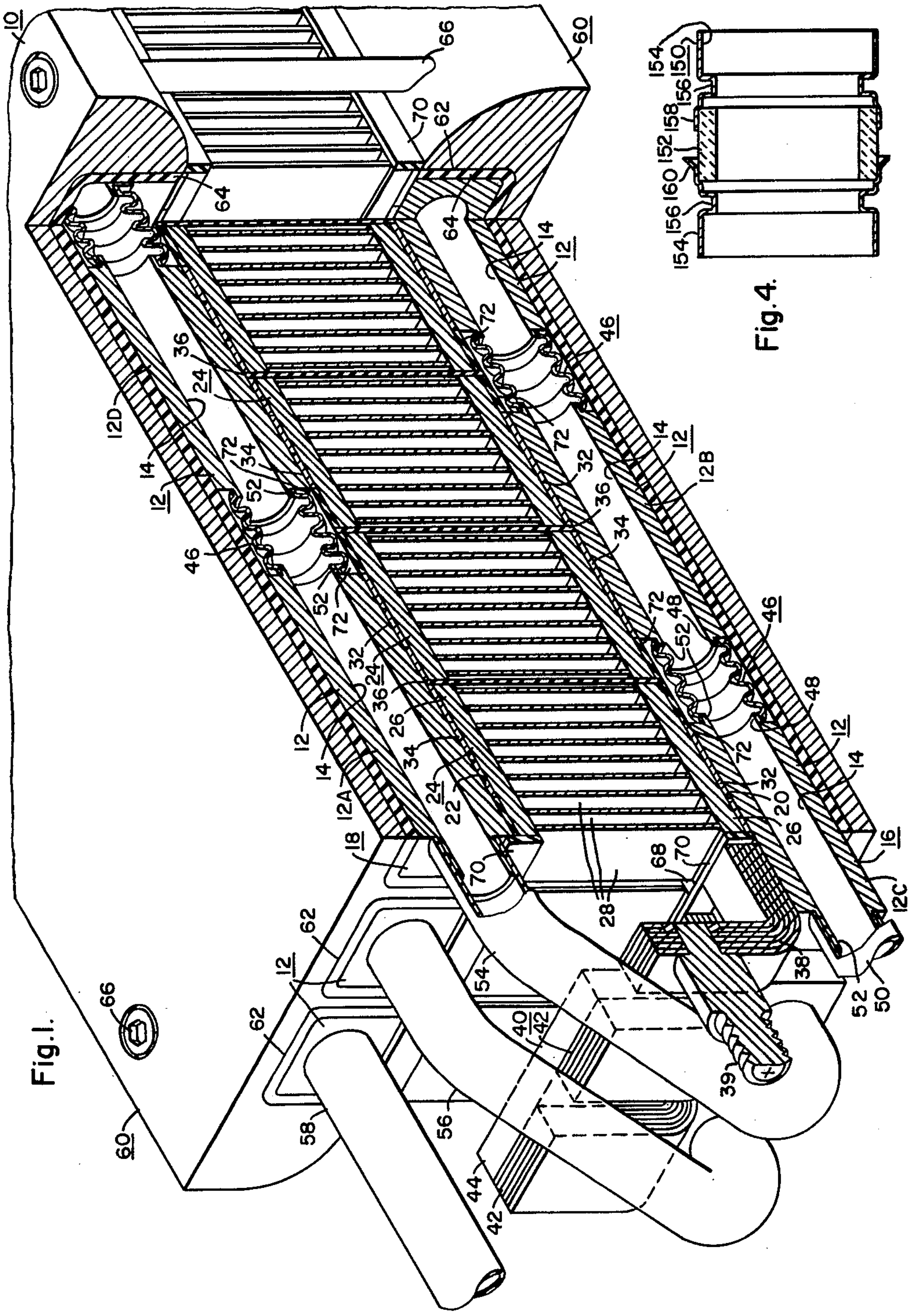
FIGURE 1 is a perspective view, partially in section, illustrating a thermopile construction incorporating the principles of the invention.
FIGURE 4 is a sectional view of another form of connecter which can be utilized in the thermopile arrangements of FIGURES 1 to 3 as a substitute for the connecters illustrated therein.

Referring now to the embodiment of this invention illustrated in FIGURE 1, it will be seen that the thermopile 10, constructed in accordance with the principles of this invention includes a plurality of heat conductive block members or modules 12 formed from electrically and thermally conductive material, such as copper or aluminum. Each of the blocks 12 includes a flow opening 14 formed therein and extending longitudinally therethrough. The blocks 12 are mounted in longitudinal rows with each row of blocks 12 being disposed at one of two levels. In the arrangement for FIGURE 1 there are provided three rows of blocks at each level with the corresponding rows of blocks at each level being in vertical alignment, respectively. The right-hand longitudinal row of blocks at the lower level in FIGURE 1 is denoted by the reference character 16 while the right-hand longitudinal row of blocks at the upper level of FIGURE 1 is denoted by the reference character 18. The blocks 12 in rows 16 and 18 are provided respectively with opposed surfaces 20 and 22 and a heat exchange fin structure denoted by the reference character 24 extends between the opposed surfaces 20 and 22.

In the example of the invention illustrated in FIGURE 1, the fin structure 24 includes a pair of base members 26 disposed respectively adjacent the surfaces 20 and 22 with the base members 26 being bridged by a plurality of relatively thin, parallelly extending spaced fins 28 which are secured at their ends to the base members 26. The base members 26 and the fins 28 are formed from electrically and thermally conductive material such as copper or aluminum with each heat exchange structure 24 in this example being sized with a lateral dimension of approximately the same size as the corresponding dimension of the block members 12. The fins 28 are mounted on the base members 26 to extend laterally with respect to the liquid openings 14 of the blocks 12. There is disposed intermediate each of the surfaces 20 and 22 of the block members 12 and the adjacent confronting surface of the adjacent base members 26 a layer of thermoelectric material designated generally by the reference characters 32 and 34. The reference character 32 denotes a layer of thermoelectrically negative material while the reference character 34 denotes a layer of thermoelectrically positive material. The thermoelectric materials may be formed from any suitable thermoelectric composition such as bismuth telluride and in this arrangement of the invention is formed from a plurality of pellets which are extended across the entire confronting area of the respective surfaces 20 and 22 in the adjacent surfaces of the base members 26 and are secured to such surfaces by suitable means such as by brazing or soldering. The polarity of a given thermoelectric layer 32 or 34 is dependent upon the desired use of the thermopile 10, that is as a thermoelectric air cooling device or a thermoelectric air heating device, bearing in mind that, as conventional current flows from the thermoelectrically negative material to thermoelectrically positive material, a cooling effect takes place between the materials. In the embodiment of the invention illustrated in FIGURE 1, it is desired that a cooling effect take place along the fins 28. Thus, as conventional current flows from the left-hand block member 12 in row 16 to the left-hand block member 12 in row 18, the thermoelectric layer between the former block member and the adjacent base 26 desirably is of a thermoelectrically negative material while the thermoelectric layer 34 between the latter block member and the adjacent base 26 is of thermoelectrically positive material.

As shown by the right-hand block **12*a* of row 18 and the second from the right-hand block 12*b* of row 16, certain of the blocks 12 are mounted to bridge adjacent heat exchange structures 24 and adjacent thermoelectric layers 32 and 34. Insulation means such as insulating sheets 36 extend between adjacent heat exchange structures 24 and adjacent thermoelectric layers 32 and 34 to create a serpentine current flow path through the thermoelectric arrangement 10 to prevent the by-passing by the current flow path of any one of the thermoelectric layers 32 or 34. The thermopile 10 provides a current flow path which begins at a terminal structure 38 secured to the module 12*c* located on the right-hand side of row 16, which terminal includes a post 39 connected to the positive side of the direct current source of power. Current then passes from the terminal structure 38 to the block 12*c* and therefrom to the thermoelectric layer 32 disposed intermediate the block 12*c* and the adjacent base structure 26 of the adjacent heat exchange device 24. Current then passes through the base structure 26 upwardly (as viewed in FIGURE 1) along each of the fins 28 to the upper base structure 26 and therefrom through the adjacent thermoelectric layer 34 to the block member 12*a*. From a block 12*a* current flows through thermoelectric layer 32, base 26, fins 28, base 26, thermoelectric layer 34 of the heat exchange structure 24 that bridges block 12*a* and block 12*b*. Current then passes through block 12*b* and therefrom to block 12*d* through thermoelectric layers 32 and 34 and that heat exchange structure 24 disposed to bridge blocks 12*b* and 12*d***.

At the far right-hand end (not shown) of the thermopile 10, there is provided additional bridging connecters connecting the right-hand longitudinally extending row of blocks to the central longitudinally extending row of blocks. While the last-mentioned terminal structure is not illustrated in FIGURE 1, it may comprise the arrangement 40 illustrated in FIGURE 1 for bridging the central longitudinal row or blocks to the left-hand longitudinal row. The bridging structure 40 desirably includes a pair of generally L-shaped terminal members 42 similar to the terminal structure 38. The members 42 are secured to the appropriate end blocks such as those similar to the blocks **12*c* to provide good electrical contact between the blocks 12 and members 42. A bridging connecter 44 desirably is secured to the adjacent terminal members 42 to complete the bridging structure 40. At the rear (not shown) of the left-hand longitudinal group of blocks, there is desirably provided an additional terminal similar in structure to the terminal structure 38 for connecting the thermopile 10** to the negative terminal of a power supply.

In the present example of this invention, each of the heat exchange structures 24 desirably are positioned for each longitudinal group of blocks with the corresponding fins thereof in lateral alignment so that a suitable gas such as air may be passed through the fins 28 to vary the temperature of the gas. Assuming that the thermopile 10 will be utilized as a cooling or air conditioning device, as current flows from the thermoelectric layers 32 to the thermoelectric layers 34, a cooling effect will take place therebetween thereby causing through thermoelectric effects the cooling of the fins 28. The fins 28 provide a suitable heat transfer area for the air flowing therepast to cool the air directly. With the cooling effect taking place in the heat exchange structures 24, it will be realized that a heating effect is concurrently occurring in each of the water blocks 12. In accordance with the invention, a liquid flow circuit is provided in the blocks or modules 12 so that the liquid is heated by the thermoelectric effects thereby causing the removal of the thermoelectrically generated heat from the blocks 12. Each of the flow openings 14 in the blocks 12 serves as a passageway in the liquid flow circuit. Conduit means are provided to connect each of the passageways 14 in a given row such as rows 16 and 18 in series. It is to be realized that the conduit means must be formed from a material having high electrical resistivity, for example from an insulator, so that the current flow path from the modules 12 is not by-passed along the conduit means. Still another criterion for the conduit means is that the resulting conduit means must be capable of absorbing relative motion caused by the thermal expansion and contraction of the block members 12 relative to one another. In accordance with the invention the conduit means may comprise a bellows structure 46 formed from a material having a relatively high electrical resistance, for example from certain of the stainless steel alloys, titanium alloys, nickel, aluminum, iron alloys such as the alloys sold under the trade names, Inconel or Inconel–X.

By high electrical resistance it is meant that the resistance of the coupling members of this invention such as bellows 46 desirably is of such a magnitude that the flow of current across the bellows is less than 5 percent and for most applications, is no more than 1 or 2 percent of the total current flow through the thermopile 10. The specific composition of the material forming the coupling members such as bellows 46 is chosen from a group of relatively high resistance materials which materials are sufficiently compatible with the material forming blocks 12 to permit a good hermetic joint to be formed therebetween. In choosing a material for the bellows 46 it is to be realized that the electrical resistivity of the material must be considered. However, total resistance across the bellows 46 is directly proportional to the length of the bellows and inversely proportional to the cross-sectional area of the material forming the bellows. The corrugated form of the bellows serves to increase the effective length and therefore the resistance thereacross. In addition, each bellows 46 is formed from relatively thin material, thereby reducing its cross-sectional area to further increase the total resistance of the bellows.

The material forming the bellows 46 desirably is metallurgically compatible with the material forming the blocks 12, so that the bellows 46 may be suitably secured to the blocks 12 to provide a hermetic seal therebetween, such as by brazing. In furtherance of this purpose each of the blocks 12 is provided with a tabulation 48 formed integrally thereon and forming an extension of the passageways 14. The bellows 46 are hermetically secured to the outward surfaces of the opposed tabulations 48 of adjacent blocks 12. The bellows 46 thereby provides a hermetically sealed passageway for the fluid circuit and also are capable of withstanding thermal expansion and contraction of adjacent water blocks 12, since the bellows 46 contract and expand, respectively, without damage thereto. The liquid flow circuit for a thermopile 10 desirably includes an inlet conduit 50, desirably formed from insulating material and secured to the tabulation 52 formed on the right-hand end of opening 14 of block 12c. Each of the blocks 12 in row 16 are formed with their openings 14 coupled in series by coupling members or bellows 46. The flow passage formed in row 16 desirably is coupled in series to the flow passage formed in row 18 by a suitable coupling element (not shown) connecting the passageways at the rear of the thermopile 10. The flow passageway of row 18 is connected in series to the flow passageway extending longitudinally through the lower longitudinal row of blocks disposed in the center of the thermopile 10 by an insulating coupling sleeve 54. The flow passageway formed by the latter row is connected to the corresponding flow passage in the upper level by a rearward connection formed similarly to the sleeve 54. A front connection is made by coupling sleeve 56 between the central longitudinally extending flow passage of the upper level to the left-hand longitudinally extending flow passage at the lower level. Still another connection is made at the rear of the thermopile 10 between the latter passageway and the corresponding left-hand passageway located at the upper level of the thermopile 10. A front connection between the latter passageway and an outlet conduit 58 is made to complete the liquid flow circuit through the thermopile 10. It will be appreciated that the liquid flow circuit of the thermopile 10 merely provides a single series flow path for liquid so that the liquid passes through each of the block members or modules 12 forming the thermopile 10.

In accordance with the invention means are provided for retaining the modules 12, heat exchange structures 24 and the remaining portions of the thermoelectric assembly 10 in fixed position resulting in a compact, shock-proof structure. In furtherance of this purpose there are provided a pair of retaining members 60 with each member being formed to coextend with the thermopile 10. More particularly, each of the retaining members 60 are provided with a plurality of longitudinally extending grooves 62 which receive the rows of block members 12 and coupling elements 46 therein. The grooves 62 are maintained in spaced relationship with the spacing being sufficient to prevent arcing of current from one of the longitudinal rows to the other, thereby preventing the by-passing of any thermoelectric layers from the current flow path. The retaining member 60 may be formed from a metal, such as copper or aluminum, or may be formed from an insulating material. In the event the retaining members 60 are formed from metal, as shown, insulation means 64 are utilized to line each of the longitudinal grooves 62 for the purpose of maintaining each of the longitudinal rows in insulated relationship with one another. Any suitable insulating material, such as a resinous sheet insulating material may be utilized as the liner 64.

In order to complete the assembly of the thermopile 10, tie rods 66 are passed through and secured at their ends to each of the retaining members 60 to retain the parts of the thermopile 10 in position.

As pointed out previously sheet insulating material 36 is utilized to separate adjacent heat exchange structures 24 of each longitudinal row. Insulation means 68 may extend between adjacent longitudinal rows of the thermopile 10 coextensively with each of the bases 26 of the heat exchange structure and with the thermoelectric layers 32 and 34, respectively. It will be further noted that the portions of each of the heat exchange structures 24 which extend coextensively with the insulating fluid conduits 46 are separated therefrom by insulating means such as insulating sheets 72 disposed in the same plane as the respective thermoelectric layers 32 and 34. Also there is desirably positioned about the outer periphery of the thermopile 10 insulation sheets 70 disposed in the same plane as the bases 26 and contiguous thermoelectric layers 32 and 34.

It will therefore be appreciated that when the thermopile 10 is assembled between the retaining members 60, each of the modules 12 are fixedly positioned with respect to the retaining members 60. Accordingly, during start-up and shutdown of the thermopile 10 wherein the temperature of the modules 12 and the heat exchange structures 24 are varied, there will occur thermal expansion and contraction, respectively, in each of the modules 12. Such thermal expansion and contraction are absorbed by the built-in flexibility of the high resistance bellows or insulating joints 46, resulting in a thermopile structure resistant to thermal shock. It will be further appreciated that the thermopile 10 comprises a structure wherein there exists no electrical or thermal insulation in the heat flow path of the thermopile. More paricularly thermoelectric heating and cooling are produced on opposed sides of each of the thermoelectric layers 32 and 34. The thermoelectric heating is conducted to the fluid passages 14 of each of the modules 12, while the thermoelectric cooling is conducted to each of the heat exchange structures 24. It is readily apparent that there is no electrical or thermal insulation located between the thermoelecric layers 34 and the adjacent modules 12 and the heat excahnge structures 24, respectively. As a result the thermopile 10 provides an arrangement wherein the benefits of a "direct transfer" thermoelectric system are achieved.

Figures 2, 3:
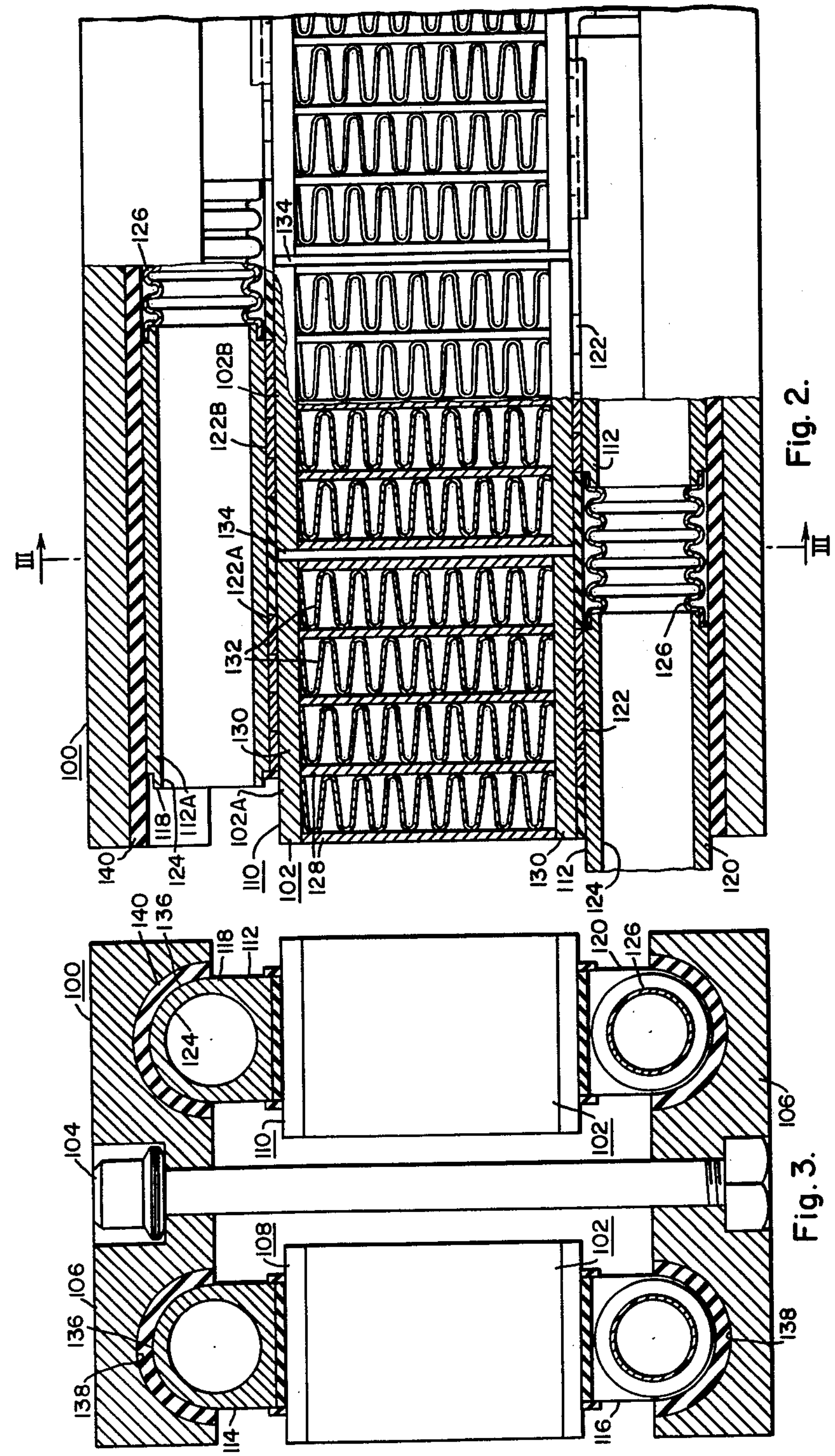
FIGURE 2 is a side elevational view, partially in section, illustrating a modification of the thermopile arrangement of FIGURE 1.
FIGURE 3 is a sectional view of the thermopile of FIGURE 2 and taken along the lines III—III thereof.

Referring now to the embodiment of this invention illustrated in FIGURES 2 and 3, it will be appreciated that there is provided a thermopile 100 which operates similarly to the thermopile 10 of FIGURE 1 with several modifications. In the arrangement of FIGURES 2 and 3, there is provided a different form of heat exchange structure 102 of FIGURES 2 and 3, a different form of tie rod arrangement 104 and retaining member arrangement 106. In addition, a thermopile 100 has two longitudinally extending rows 108 and 110 of assemblies rather than the three rows of the FIGURE 1 arrangement. Furthermore, in FIGURES 2 and 3, the block members or modules 112 are provided with a semicircular side disposed opposite the thermoelectric layer, rather than a generally rectangular cross section of FIGURE 1. In all other respects, the thermopile 100 of FIGURES 2 and 3 corresponds to the arrangement of the thermopile 10 of FIGURE 1. In this regard, the operating principles of the thermopile 100 together with the corresponding structures will not again be described.

In the thermopile arrangement of FIGURES 2 and 3 each of the longitudinally extending rows 108 and 110 of heat exchange assemblies includes a pair of longitudinal rows of block members or modules 112 with a row 114 being disposed at an upper level and a row 116 being disposed at a lower level. Similarly, the longitudinally extending row 110 includes modules 112 forming a row 118 at the upper level and a row 120 at the lower level. The heat exchange structure 102 is disposed between the heat exchange blocks 112 at the upper and lower levels and there is positioned therebetween layers of thermoelectric material 122 with predetermined ones of the layers 122 being formed from thermoelectrically positive and thermoelectrically negative material. As previously described in connection with FIGURE 1, certain of the block members 112 are disposed in bridging relationship between adjacent heat exchange structures 102 resulting in a serpentine current flow path. The current flow path extends in part from the heat exchange structure 102*a* to the thermoelectric layer 122*a*, thence to the module 112*a* and therefrom to the thermoelectric layer 122*b* and heat exchange structure 102*b*. The modules 112 are each provided with openings 124 therein with the openings 124 for each of the rows 114, 116, 118 and 120 being disposed in alignment. The openings 124 are connected together by a suitable expansible and contractible coupling member such as bellows 126 with the latter being formed from highly resistive material as explained in connection with the bellows 46 of FIGURE 1 to provide the desired serpentine current flow path through the thermopile 100. Each of the heat exchange structures 102 includes a plurality of spaced fins 128 which are secured to a pair of spaced bases 130, with the fins 128 extending laterally with respect to the openings 124. Disposed intermediate each of the adjacent fins 128 are metallic corrugations 132 which engage the fins 128 at several positions along the length thereof so that the corrugations 132 serve to increase the heat transfer area in the heat exchange structure 102. Adjacent heat exchange structures 102 are maintained in spaced relationship as illustrated by the space 134 to prevent the short circuiting of the current flow path directly from one heat exchange structure 102 to the other. Similarly, adjacent longitudinal rows 108 and 110 are maintained in spaced relationship, as illustrated in FIGURE 3.

In this example of the invention, each of the retaining members 106 serves to retain a pair of longitudinally extending rows. Accordingly, tie rods 104 connect the upper and lower retaining members 106 at a position intermediate the rows 108 and 110, rather than about the periphery of the thermopile as illustrated in FIGURE 1. In addition, each of the modules 112 includes a semicircular surface 136 which is received in a pair of complementarily shaped longitudinally extending recesses 138 formed in each retaining member 106. In the event the retaining members 106 are formed from a metal, there is interposed between the blocks 112 and the retaining member 106 complementarily shaped insulating sheets 140 which serve to maintain each of the rows electrically insulated from one another.

It will be appreciated that appropriate bridging structures such as the structure 40 of FIGURE 1 and appropriate terminals such as the terminal 38 are utilized with the thermopile 100 of FIGURES 2 and 3 for the purpose of connecting the rows 108 and 110 in electrical series with one another as well as to a source of electrical power. Furthermore, it will be appreciated that each of the openings 124 of the rows 114, 116 and 118 and 120 are connected in series and to inlet and outlet conduits in a manner similar to the arrangement illustrated in FIGURE 1.

Referring now to FIGURE 4 there is illustrated an alternate coupling member 150 which may be substituted for the high resistance bellow structures 46 and 126 of FIGURES 1 to 3. The coupling structure 150 of FIGURE 4 includes a central ring member 152 formed from insulating material such as a ceramic member formed from aluminum oxide or beryllium oxide. Secured to the ring member 152 are a pair of metallic sleeves which may be formed from any material compatible with the material forming the modules 12 or 112. The sleeves 154 may be electrically conducting and are chosen to facilitate the hermetic securing operation between the sleeves 154 and the appropriate flange, such as the flanges 52 on the module blocks 12. With the coupling element of FIGURE 4 the problems encountered in the hermetic sealing of a high resistance material forming the bellows 46 of FIGURE 1 with the material forming the modules 12 is avoided. In the FIGURE 4 arrangement, the sleeves 154 may be formed from an electrical conductor and therefore can be formed from the same material forming the modules 12, for example copper or aluminum. Each of the sleeves 154 desirably is provided with a circumferential indentation 156 therein which provides an area capable of absorbing thermal expansion and contraction forces exerted thereon by adjacent modules 12. In this manner each of the sleeves 154 acts as a bellows. A ceramic to metallic joint is made between the ceramic sleeve 152 and the metallic sleeves 154. In furtherance of this purpose each of the sleeves 154 is provided with an extension 158 and 160 thereon which overlies and closely receives the outer surface of the ceramic sleeve 152 with adjacent extensions 158 and 160 being spaced from one another in insulated relationship. Procedures for forming ceramic to metallic joints, together with the choosing of ceramic and metallic materials having corresponding thermal characteristics are well known in the art.

It will be appreciated that the ceramic to metallic joint between the sleeves 152 and 154 can be performed prior to assembly of a thermopile 10 or 100 and that the metallic to metallic joint between the sleeve 154 and the modules 12 or 112, which are more easily fabricated, is performed during final assembly of the thermopile arrangement.

Figure 5:
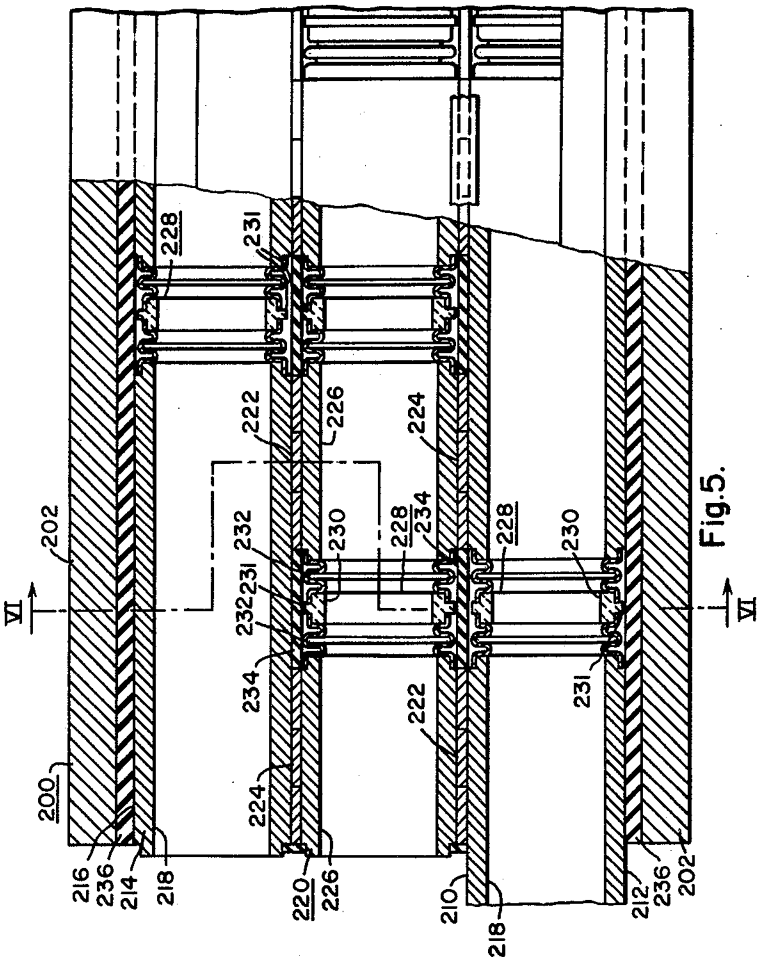
FIGURE 5 is an elevational view, partially in section, of another embodiment of this invention utilizing connecters similar to those of FIGURE 4 and illustrating a liquid to liquid thermopile arrangement.
Figure 6:
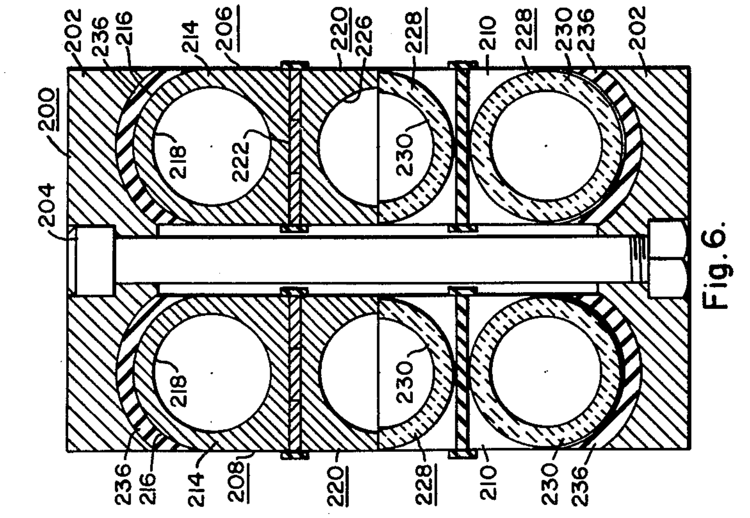
FIGURE 6 is a sectional view of the arrangement of FIGURE 5 taken substantially along the lines VI—VI thereof.

Referring now to the embodiment of the invention illustrated in FIGURES 5 and 6, it will be appreciated that there is provided therein a thermopile arrangement 200 generally similar to the thermopile arrangement 100 of FIGURES 2 and 3 with the exception that the gaseous heat exchange means 102 of FIGURES 2 and 3 has been replaced by a liquid flow path arrangement.

More particularly, there are provided a pair of retaining members 202 for positioning the components of the thermopile 200 by means of tie rods 204 extending centrally between a pair of longitudinally extending spaced rows 206 and 208. Each of the rows 206 and 208 includes a block member or module 210 having a generally semicircular shaped lower surface 212 and a plurality of upper block members or modules 214 having a generally semicircular shaped upper surface 216. The modules 212 and 214 are each provided with longitudinally extending flow passages 218 therethrough with the flow passages 218 of each module 210 and 214 being connected in series to provide, in this example of the invention, a heated fluid flow circuit for the thermopile 200. The cooled fluid flow circuits of the thermopile 200 comprises a plurality of block members or modules 220 formed of a generally rectangular cross section and disposed intermediate the upper and lower modules 214 and 210. Layers of thermoelectric material 222 and 224 are positioned respectively between the opposed surfaces of the module 220 and the modules 210 and 214. Each of the modules 220 is provided with a longitudinally extending fluid passageway 226 therein with each of the adjacent passageways 226 being coupled together by coupling members 228 which are formed to electrically insulate adjacent modules 220 from one another. In furtherance of this purpose, each of the coupling members 228 includes a centrally disposed sleeve 230 formed from an insulating material such as a high density ceramic material. Secured to each of the ceramic rings 230 are a pair of bellows arrangement 232 which may be formed from an electrically conducting material which is metallurgically compatible with the material forming the ceramic ring 230 and the material forming the modules 220. Each ring 230 is provided with a flange 231 thereon to maintain the adjacent bellows 232 in insulated relationship. The materials forming the connecters 228 may comprise the same materials described in connection with the connecters 150 of FIGURE 4. Each of the connecters 228 is capable of becoming elongated and contracted upon thermal expansion and contraction of the modules 220 during operation of the thermopile 200. Layers of insulating material 234 are mounted in vertical alignment with the connecters 228 and are disposed in the same planes as the thermoelectric layers 222 and 224. In accordance with the invention, each of the heated fluid modules 210 and 214 are connected to the next adjacent modules by connecters 228 with the connecters 228 being hermetically secured to the modules 210 or 214.

The modules 220 desirably are constructed to be approximately one-half of the length of the modules 210 and 214 so that appropriate modules 210 and 214 serve to bridge electrically adjacent layers of thermoelectric material along the desired serpentine current flow path of the thermopile 200. Referring to FIGURE 5, it will be appreciated that the current flow path through the thermopile 200 extends from the left-hand lower module 210 through the thermoelectric layer 222 to the left-hand module 220. From the module 220, the current flow path passed through the thermoelectric layer 224, the upper left-hand module 214, and therefrom to the thermoelectric layer 222 located to the right of the last mentioned thermoelectric layer 224, and downwardly therefrom through the adjacent module 220, thermoelectric layer 224 and module 210. The insulating couplings 228 maintain the serpentine electrical flow path in the thermopile 200 while still providing an arrangement wherein there exists no electrical or thermal insulation in the heat flow path between the thermoelectric layers and the heated and cool fluids. The row of modules 220 located in row 206 is desirably connected in series to the modules 220 located in row 208 by suitable means such as by the insulating conduit 62 illustrated in FIGURE 1 and the series connected flow passageways 226 are connected by inlet and outlet conduits (not shown) which may couple the flow passageways 226 to a source of fluid to be cooled.

It will be appreciated that the foregoing description of the arrangement of FIGURES 5 and 6 relate to the provision of fluid to be heated through the passageways 218 and the provision of fluid to be cooled through the passageways 226. In this connection each of the thermoelectric layers 222 desirably is constructed from p-type thermoelectric material while the thermoelectric layers 224 are formed from n-type thermoelectric material. It will be further appreciated that in the event the retaining members 202 are formed from metallic compositions, complementarily shaped layers of sheet type insulating material 236 are disposed between the modules 210 and 214 and the adjacent retaining members 202.

In connection with the aforedescribed embodiments of this invention, it will be appreciated that in the arrangements of FIGURE 1, FIGURES 2 and 3, and FIGURES 5 and 6, the thermoelectric apparatus has been described to provide a centrally disposed cooled fluid flow path with a heated fluid flow path disposed above and below the cooled fluid flow path. In the event the reverse heat flow pattern is desired in the thermopiles, it is merely necessary to reverse the current flow path to provide for cooled fluid at the upper and lower levels of the thermopile with the heating of fluid occurring at the central or intermediate level. Furthermore, the thermopiles 10, 100 and 200 herein described may also act as thermoelectric generators merely by providing fluids of differing temperatures to the heated and cooled fluid flow paths, thereby producing electrical power at the thermopile terminals.

In this connection, it will be appreciated that many further modifications of the apparatus described in detail herein may be made without departing from the broad spirit and scope of this invention. Accordingly, it is specifically intended that the specific embodiments of the invention described herein be interpreted in an illustrative, rather than in a limiting sense.

We claim as our invention:

1. In a thermoelectric device, at least two block members formed from thermally, and electrically conductive material, each of said block members having a flow opening therein, means for connecting said flow openings in series comprising a coupling member extending longitudinally between and hermetically secured to each of said block members, said coupling member being formed from a material which is highly resistant to the flow of electrical current therealong, said coupling member having means thereon for absorbing longitudinal expansive and compressive forces exerted thereon, a layer of thermoelectric material secured to one of said block members, and means interposed between said layer and the other of said block members forming an electrically conductive path therebetween.

2. In a thermoelectric device, at least two block members formed from thermally and electrically conductive material, each of said block members having a flow opening therein, means for connecting said flow openings in series comprising a coupling member extending longitudinally between and hermetically secured to each of said block members, said coupling member comprising a bellows formed from a metal having a relatively high electrical resistance, a layer of thermoelectric material secured to one of said block members, and means interposed between said layer and the other of said block members forming an electrically conductive path therebetween.

3. In a thermoelectric device, at least two block members formed from thermally and electrically conductive material, each of said block members having a flow opening therein, a coupling member for connecting said flow openings in series, said coupling member comprising a sleeve of insulating material, a pair of sleeves of electrically conductive material which is metallurgically compatible with the material forming said insulating sleeve, each of said metallic sleeves being hermetically secured at one end to said insulating sleeve in insulated relationship with one another, said metallic sleeves being metallurgically compatible with the material forming said block members, the other ends of said metallic sleeves being hermetically secured to said block members, respectively, a layer of thermoelectric material secured to one of said block members, and means interposed between said layer and the other of said block members forming an electrically conductive path therebetween.

4. In a thermoelectric device, at least two block members formed from thermally and electrically conductive material, each of said block members having a flow opening therein, a coupling member for connecting said flow openings in series, said coupling member comprising a sleeve of insulating material, a pair of sleeves of electrically conductive material which is metallurgically compatible with the material forming said insulating sleeve, each of said metallic sleeves being hermetically secured at one end to said insulating sleeve in insulated relationship with one another, said metallic sleeves being metallurgically compatible with the material forming said block members, the other ends of said metallic sleeves being hermetically secured to said block members, respectively, at least one of said metallic sleeves having means thereon for absorbing longitudinal expansive and compressive forces exerted thereon, a layer of thermoelectric material secured to one of said block members, and means interposed between said layer and the other of said block members forming an electrically conductive path therebetween.

5. In a thermoelectric device, at least two block members formed from thermally and electrically conductive material, each of said block members having a flow opening therein, means for connecting said flow openings in series comprising a coupling member extending longitudinally between and hermetically secured to each of said block members, said coupling member being formed from a material which is highly resistant to the flow of electrical current therealong, said coupling member having means thereon for absorbing longitudinal expansive and compressive forces exerted thereon, a layer of thermoelectric materials secured to one of said block members, means interposed between said layer and the other of said block members forming an electrically conductive path therebetween, and retaining means fixedly positioning said block members relative to one another.

6. In a thermoelectric device, a pair of spaced layers of thermoelectric material, one of said layers being thermoelectrically positive and the other of said layers being thermoelectrically negative, a pair of electrically conductive base members mounted in spaced relationship and secured in electrical contact to said layers of thermoelectric material, respectively, a plurality of spaced electrically conductive fin members extending between and secured at their ends to said base members in electrical contact therewith, and terminal means coupled to said thermoelectric layers for supplying electrical current from one of said layers to the other along a path formed by said base members and said fins, whereby one of the conditions of thermoelectric cooling and thermoelectric heating is imparted to said fins.

7. In a thermoelectric device, a pair of spaced block members formed from thermally and electrically conductive material, each of said block members having a flow opening therein, a layer of thermoelectrically positive material mounted on one of said block members, a layer of thermoelectrically negative material mounted on the other of said block members, a plurality of spaced, electrically conductive fins extending between and secured to said thermoelectric layers, means for connecting said flow openings in series comprising a coupling member extending longitudinally between and hermetically secured to each of said block members, said coupling member being formed from a material which is highly resistant to the flow of electrical current therealong, and said coupling member having means thereon for absorbing longitudinal expansive and compressive forces exerted thereon.

8. In a thermoelectric heat exchange device, a first, second, and third thermally and electrically conductive block member, a first pair of thermoelectric layers mounted in spaced relationship on said first block member; a second pair of thermoelectric layers mounted on said second and third block members, respectively, a first group of thermally and electrically conductive, spaced fins secured to said thermoelectric layer mounted on said second block member and to one of said first pair of thermoelectric layers, a second group of thermally and electrically conductive fins secured to said thermoelectric layer mounted on said third block member and to the other of said first pairs of thermoelectric layers, said second fin group being mounted in insulated relationship with said first group except along a path through said first block member and said first pair of thermoelectric layers, said second and said third block members each having a flow opening formed therein, a coupling member extending between and hermetically secured to said second and third block members for connecting said flow openings in series, said coupling member being formed to prevent the flow of electrical current therealong from one of said second and third block members to the other, and terminal means electrically coupled to said second and third block members.

9. In a thermoelectric heat exchange device, a first, second, and third thermally and electrically conductive block member, a first pair of spaced thermoelectric layers mounted in spaced relationship on said first block member, a second pair of thermoelectric layers mounted on said second and third block members, respectively, a first thermally and electrically conductive bridging member secured to said thermoelectric layer mounted on said second block member and to one of said first pair of thermoelectric layers, a second thermally and electrically conductive bridging member secured to said thermoelectric layer mounted on said third block member and to the other of said first pairs of thermoelectric layers, said second bridging member being mounted in insulated relationship with said first bridging member except along a path through said first block member and said first pair of thermoelectric layers, said second and said third block members each having a flow opening formed therein, a coupling member extending between and hermetically secured to said second and third block members for connecting said flow openings in series, said coupling member being formed to prevent the flow of electrical current therealong from one of said second and third block members to the other, and terminal means electrically coupled to said second and third block members.

10. In a thermoelectric heat exchange device, a first, second, and third thermally and electrically conductive block member, a first pair of spaced thermoelectric layers mounted in spaced relationship on said first block member, a second pair of thermoelectric layers mounted on said second and third block members, respectively, a first thermally and electrically conductive bridging member secured to said thermoelectric layer mounted on said second block member and to one of said first pair of thermoelectric layers, a second thermally and electrically conductive bridging member secured to said thermoelectric layer mounted on said third block member and to the other of said first pairs of thermoelectric layers, said second bridging member being mounted in insulated relationship with said first bridging member except along a path through said first block member and said first pair of thermoelectric layers, said second and said third block members each having a flow opening formed therein, a coupling member extending between and hermetically secured to said second and third block members for connecting said flow openings in series said coupling member comprising at least one bellows structure and formed to prevent the flow of electrical current therealong from one of said second and third block members to the other, and thermal means electrically coupled to said second and third block members.

11. In a thermoelectric heat exchange device, a first, second, and third thermally and electrically conductive block member, a first pair of spaced thermoelectric layers mounted in spaced relationship on said first block member, a second pair of thermoelectric layers mounted on said second and third block members, respectively, a first thermally and electrically conductive bridging member secured to said thermoelectric layer mounted on said second block member and to one of said first pair of thermoelectric layers, a second thermally and electrically conductive bridging member secured to said thermoelectric layer mounted on said third block member and to the other of said first pairs of thermoelectric layers, said second bridging member being mounted in insulated relationship with said first bridging member except along a path through said first block member and said first pair of thermoelectric layers, said second and said third block members each having a flow opening formed therein, a coupling member extending between and hermetically secured to said second and third block members for connecting said flow openings in series, said coupling member comprising at least one bellows structure and formed to prevent the flow of electrical current therealong from one of said second and third block members to the other, terminal means electrically coupled to said second and third block members, and a pair of retaining members for fixedly positioning said block members relative to one another.

12. In a thermoelectric heat exchange device, a first, second, and third thermally and electrically conductive block member, a first pair of spaced thermoelectric layers mounted in spaced relationship on said first block member, a second pair of thermoelectric layers mounted on said second and third block members, respectively, a first group of thermally and electrically conductive spaced fins secured to said thermoelectric layer mounted on said second block member and to one of said first pair of thermoelectric layers, a second group of thermally and electrically conductive fins secured to said thermoelectric layer mounted on said third block member and to the other of said first pairs of thermoelectric layers, said second fin group being mounted in insulated relationship with said first fin group except along a path through said first block member and said first pair of thermoelectric layers, said second and said third block members each having a flow opening formed therein, a coupling member extending between and hermetically secured to said second and third block members for connecting said flow openings in series, said coupling member being formed to prevent the flow of electrical current therealong from one of said second and third block members to the other, said coupling member being expansible and contractable to absorb thermally influenced changes in the spacing between said second and third block members, terminal means electrically coupled to said second and third block members, and a pair of retaining members fixedly positioning said block members relative to one another.

13. In a thermoelectric heat exchange device, a first, second, and third thermally and electrically conductive block member, a first pair of spaced thermoelectric layers mounted in spaced relationship on said first block member, a second pair of thermoelectric layers mounted on said second and third block members, respectively, a fourth block member, secured to said thermoelectric layer mounted on said second block member and to one of said first pair of thermoelectric layer, a fifth block member secured to said thermoelectric layer mounted on said third block member and to the other of said first pair of thermoelectric layers, said fifth block member being mounted in insulated relationship with said fourth block member except along a path through said first block member and said first pair of thermoelectric layers, said second and said third block members each having a flow opening formed therein, a first coupling member extending between and hermetically secured to said second and said third block members for connecting the flow openings thereof in series, said fourth and said fifth block members each having a flow opening formed therein, a second coupling member extending between and hermetically secured to said fourth and said fifth block members for connecting the flow openings thereof in series, said first and second coupling members each being formed to prevent the flow of electrical current therealong, and terminal means electrically coupled to said second and third block members.

14. In a thermoelectric heat exchange device a first, second, and third thermally and electrically conductive block member, a first pair of spaced thermoelectric layers mounted in spaced relationship on said first block member, a second pair of thermoelectric layers mounted on said second and third block members, respectively, a fourth block member, secured to said thermoelectric layer mounted on said second block member and to one of said first pair of thermoelectric layers, a fifth block member secured to said thermoelectric layer mounted on said third block member and to the other of said first pairs of thermoelectric layers, said fifth block member being mounted in insulated relationship with said fourth block member except along a path through said first block member and said first pair of thermoelectric layers, said second and said third block members each having a flow opening formed therein, a first coupling member extending between and hermetically secured to said second and said third block members for connecting the flow openings thereof in series, said fourth and said fifth block members each having a flow opening formed therein, a second coupling member extending between and hermetically secured to said fourth and said fifth block members for connecting the flow openings thereof in series, said first and second coupling members each being formed to prevent the flow of electrical current therealong, said coupling members each being expansible and contractable to absorb thermally influenced changes in the sizes of said block members, a pair of retaining members fixedly positioning said block members relative to one another, and terminal means electrically coupled to said second and third block members.

15. In a thermoelectric heat exchange device, a first elongated block member, a second and a third block member, each of said block members being formed from thermally and electrically conductive material, a first pair of spaced thermoelectric layers mounted in spaced relationship on said first block member, a second pair of thermoelectric layers mounted on said second and third block members, respectively, a fourth block member, secured to said thermoelectric layer mounted on said second block member and to one of said first pair of thermoelectric layers, a fifth block member secured to said thermoelectric layer mounted on said third block member and to the other of said first pairs of thermoelectric layers, said fifth block member being mounted in insulated relationship with said fourth block member except along a path through said first block member and said first pair of thermoelectric layers, said second and said third block members each having a flow opening formed therein, a first coupling member extending between and hermetically secured to said second and said third block members for connecting the flow openings thereof in series, said fourth and said fifth block members each having a flow opening formed therein, a second coupling member extending between and hermetically secured to said fourth and said fifth block members for connecting the flow openings thereof in series, said first and second coupling members each being formed to prevent the flow of electrical current therealong, said fourth and fifth block members and said second coupling member extending substantially coextensively with the longitudinal dimension of said first block member, and terminal means electrically coupled to said second and third block members.

16. In a thermoelectric heat exchange device, a pair of spaced block members formed from thermally and electrically conductive material and each having a flow passageway formed therein, a bellows formed from insulating material hermetically secured at its ends to said block members and disposed to connect said flow passageways in series, a layer of thermoelectric material secured to one of said block members, means forming a current flow path from one of said block members to the other through said thermoelectric layer, said current path means including at least in part a heat exchange structure secured to said thermoelectric layer, and said heat exchange structure including a plurality of spaced fins thereon.

17. In a thermoelectric heat exchange device, a pair of spaced block members formed from thermally and electrically conductive material and each having a flow passageway formed therein, a bellows formed from insulating materials hermetically secured at its ends to said block members and disposed to connect said flow passageways in series, a layer of thermoelectric material secured to one of said block members, means forming a current flow path from one of said block members to the other through said thermoelectric layer, said current path means including at least in part a heat exchange structure secured to said thermoelectric layer, and said heat exchange structure including a plurality of spaced fins thereon, and a corrugated heat conductive structure extending laterally between adjacent ones of said fins and engaging said fins at several places along one dimension thereof.

18. In a thermoelectric heat exchange device, a plurality of longitudinally extending groups of electrically conducting heat exchange means, each of said groups including heat exchange means disposed at each of a lower, intermediate and upper level, each of said levels having a plurality of tandemly arranged heat exchange means with longitudinally adjacent ones thereof being mounted in insulated relationship with one another, respectively, a plurality of first thermoelectric means interposed between adjacent ones of said lower level heat exchange means and said intermediate level heat exchange means, a plurality of second thermoelectric means interposed between adjacent ones of said intermediate level heat exchange means and said upper level heat exchange means, the polarities of said thermoelectric means being selected to produce thermoelectric cooling in each of said heat exchange means located in at least one of said levels and to produce thermoelectric heating in each of said heat exchange means of the remainder of said levels when electrical current flows therethrough, those heat exchange means located in at least one of said levels each having liquid flow openings formed therein, means for connecting said liquid flow openings in series, said last-mentioned means including a plurality of connectors hermetically secured to said last-mentioned heat exchange means, respectively, and formed from material resistant to the flow of electrical current therethrough, said connectors each being expansible and contractable to absorb thermally influenced changes in the sizes of said last-mentioned heat exchange means, at least some of said lower level heat exchange means being sized to engage two predetermined longitudinally adjacent ones of said first thermoelectric means, said upper level heat exchange means being sized to engage two predetermined longitudinally adjacent ones of said second thermoelectric means to form a serpentine current flow path through said heat exchange means and through said thermoelectric means, and retaining means disposed to engage said heat exchange means of said upper and lowest levels of each of said groups to fixedly position all of said heat exchange means.

19. In a thermoelectric device, at least two spaced block members formed from thermally and electrically conductive material, each of said block members having a flow opening therein to expose the adjacent surfaces of said block members directly to fluid flowing through said openings, means for connecting said flow openings in series comprising a tubular coupling member extending longitudinally between and hermetically secured at its ends to said block members, said coupling member being formed from a material which is highly resistant to the flow of electrical current therealong, a layer of thermoelectric material secured to one of said block members, and means interposed between said layer and the other of said block members forming an electrically conductive path therebetween.

References Cited by the Examiner

UNITED STATES PATENTS

| | | | |
|---|---|---|---|
| 2,997,514 | 8/61 | Roeder | 62—3 |
| 3,040,538 | 6/62 | Alsing | 62—3 |
| 3,087,002 | 4/63 | Henderson | 62—3 |

ROBERT A. O'LEARY, *Primary Examiner.*

WILLIAM J. WYE, *Examiner.*